United States Patent
Xu et al.

(10) Patent No.: US 10,801,955 B2
(45) Date of Patent: Oct. 13, 2020

(54) NUMERICAL CHARACTERIZATION METHOD FOR DISPERSION STATE OF CARBON NANOTUBE BASED ON FRACTAL DIMENSION

(71) Applicant: HUAZHONG UNIVERSITY OF SCIENCE AND TECHNOLOGY, Hubei (CN)

(72) Inventors: Ming Xu, Hubei (CN); Mengmeng Zhang, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 56 days.

(21) Appl. No.: 16/341,923

(22) PCT Filed: Nov. 30, 2016

(86) PCT No.: PCT/CN2016/108061
§ 371 (c)(1),
(2) Date: Apr. 15, 2019

(87) PCT Pub. No.: WO2018/086168
PCT Pub. Date: May 17, 2018

(65) Prior Publication Data
US 2019/0242815 A1 Aug. 8, 2019

(30) Foreign Application Priority Data
Nov. 9, 2016 (CN) .......................... 2016 1 0984658

(51) Int. Cl.
*G01N 21/41* (2006.01)
*H01J 37/22* (2006.01)
(Continued)

(52) U.S. Cl.
CPC ............. *G01N 21/41* (2013.01); *G01B 11/24* (2013.01); *G01N 1/38* (2013.01); *G01N 15/0227* (2013.01);
(Continued)

(58) Field of Classification Search
CPC ...... G01N 21/41; G01N 15/0227; G01N 1/38; G01N 2015/0042; G01N 2015/0038;
(Continued)

(56) References Cited

U.S. PATENT DOCUMENTS 10,020,191 B2 * 7/2018 Li et al. .................... G06T 7/12
2011/0027486 A1 * 2/2011 Jiang ...................... H01J 37/20
427/331

FOREIGN PATENT DOCUMENTS

CN 104794716 7/2015

OTHER PUBLICATIONS

Ding et al. "Blind image quality assessment based on fractal description of natural scenes" Electronics Letters, Feb. 19, 2015, pp. 338-339.
(Continued)

*Primary Examiner* — Christopher M Brandt
(74) *Attorney, Agent, or Firm* — JCIPRNET

(57) ABSTRACT

A numerical characterization method for the dispersion state of carbon nanotubes based on fractal dimension is invented. In this method, a SEM image of the dispersion state of carbon nanotube is obtained first, and then is binarized by the ImageJ software to extract the boundary of individual carbon nanotubes or carbon nanotubes agglomerates, and thereby calculating the fractal dimension of the processed image with the assistance of the box-count algorithm. The value of fractal dimension represents quantitatively the abundant information contained in the dispersion state of carbon nanotubes, which is capable of realizing the numeri-
(Continued)

cal characterization of the dispersion state of carbon nanotubes. The invention quantifies the dispersion state of carbon nanotubes, and provides a powerful strategy for controlling, comparison and prediction of macro-properties of carbon nanotube based composites.

16 Claims, 6 Drawing Sheets

(51) Int. Cl.
*G01N 1/38* (2006.01)
*G02B 21/36* (2006.01)
*G01B 11/24* (2006.01)
*G01N 15/02* (2006.01)
*G01N 21/17* (2006.01)
*G01N 15/00* (2006.01)

(52) U.S. Cl.
CPC .......... *G02B 21/365* (2013.01); *H01J 37/222* (2013.01); *G01N 2015/0038* (2013.01); *G01N 2015/0042* (2013.01); *G01N 2021/1765* (2013.01); *G01N 2021/4113* (2013.01); *G06T 2207/10061* (2013.01)

(58) Field of Classification Search
CPC ... G01N 2021/1765; G01N 2021/4113; G01N 2223/418; G01N 2223/401; G01N 2223/402; G01N 2223/102; G01N 2223/40; G01N 23/2251; G01B 11/24; H01J 37/222; G02B 21/365; G06T 2207/10061
See application file for complete search history.

(56) References Cited

OTHER PUBLICATIONS

"International Search Report (Form PCT/ISA/210)", dated Jul. 14, 2017, with English translation thereof, pp. 1-6.

* cited by examiner

NUMERICAL CHARACTERIZATION METHOD FOR DISPERSION STATE OF CARBON NANOTUBE BASED ON FRACTAL DIMENSION

CROSS-REFERENCE TO RELATED APPLICATION

This is a 371 application of the International PCT application serial no. PCT/CN2016/108061, filed on Nov. 30, 2016, which claims the priority benefits of China Application No. 201610984658.X, filed on Nov. 9, 2016. The entirety of each of the above-mentioned patent applications is hereby incorporated by reference herein and made a part of this specification.

BACKGROUND

Technical Field

The invention relates to the production and application of nanocomposite materials, and particularly relates to the numerical characterization method for dispersion state of carbon nanotubes based on fractal dimension, which is applied to evaluate the dispersion state of carbon nanotubes by using fractal dimension accurately and quantitatively.

Description of Related Art

Carbon nanotubes have excellent electrical and mechanical properties, which are often used as the filler materials for the composite materials to enhance their electrical and mechanical properties. During the preparation process of composite materials, the dispersion state of the carbon nanotubes is the key factor which affect the performances of composite materials. Since Ajayan first fabricated carbon nanotube composites by using the ultrasonic method in 1993, researchers have been searching for various methods to characterize the dispersion state of carbon nanotubes in dispersion systems. Currently, main characterization methods can be classified into morphological methods and spectroscopic methods according to their different mechanisms. The morphological methods includes optical microscope, scanning electron microscope (SEM) and transmission electron microscope (TEM), which are directly used to characterize the structural morphology of carbon nanotubes in the dispersion system to evaluate the dispersion state of carbon nanotubes. The spectroscopic methods are used to evaluate the amount of carbon nanotubes in the suspension of the dispersion system by using ultraviolet-visible spectroscopy. By comparing the spectrums of different samples, the dispersion state of carbon nanotubes can be evaluated. However, the spectroscopic methods can only estimate the amount of the carbon nanotubes in the suspension of the dispersion system, which cannot provide the size and morphology of carbon nanotube aggregates. So, these methods have great shortcomings in evaluating the dispersion state of carbon nanotubes. The morphological methods can reflect the disentanglement level and size changes of the carbon nanotube aggregates in the dispersion system, so they can be used to comprehensively characterize the dispersion state of carbon nanotubes. However, this method can only qualitatively describe the dispersion state of carbon nanotubes, so the morphological methods also have certain deficiencies in evaluating the dispersion state of carbon nanotubes.

In recent years, using morphological methods to characterize the dispersion state of carbon nanotubes, and performing numerical process on the obtained images attract more and more attention from researchers. To perform the numerical process on the images, abundant information (such as concentration, diameter and length of carbon nanotubes, and dispersion conditions) contained in the dispersion state of carbon nanotubes can be described by a value, thereby realizing the quantitative evaluation of the dispersion state of carbon nanotubes. The literature of Carbon 2011, 49(4): 1473-1478 reported a method for characterizing the dispersion state of carbon nanotubes by using a position randomness index based on SEM images. In this method, the smaller position randomness index indicated the less probability of the gathering of adjacent carbon nanotubes, which represented good dispersion state of carbon nanotubes. However, the strategy of such method was based on the calculation of nanoparticle dispersion system, which didn't take the nanofiber feature of carbon nanotubes into account. Therefore, this numerical method has great limitations in the evaluation of the dispersion state of carbon nanotubes.

In view of the above technical problems, there is not yet an accurate, effective and convenient numerical characterization method for the evaluation of the dispersion state of carbon nanotubes so far. Therefore, to solve the above technical difficulties, the strategy of this invention is to work out an effective numerical characterization method to realize the infinite approximation to the actual dispersion state.

SUMMARY

In view of the above defects or improvement requirements of the prior art, this invention provides a numerical characterization method for the dispersion state of carbon nanotubes based on fractal dimension, and the purpose is to use fractal dimension to accurately and quantitatively evaluate the dispersion state of carbon nanotubes, thereby controlling and predicting the properties of composites during the fabrication of carbon nanotubes composites.

In order to achieve the aforementioned objects, this invention provides a calculation method by calculating the fractal dimension values based on SEM images, which adopts box-count algorithm, and the equation of box-count algorithm is:

$$D = \lim_{i \to \infty} \frac{\ln N_i}{\ln \delta_i}$$

where $\delta_i$ is the side size of box, $N_i$ is the total number of the boxes with the side size of $\delta_i$ that covers the region occupied by the boundary edges of carbon nanotubes or carbon nanotube agglomerates in a processed SEM image, and D is fractal dimension.

Preferably, the minimum size of the side size $\delta_i$ in the image is the length represented by a pixel, and the maximum size of the side size $\delta_i$ is the length represented by the total number of pixels in horizontal or vertical direction in the image.

Preferably, for an image, the length represented by one pixel is between 0.34 nm and 100 nm, such that when the boxes with the minimum size cover the boundary edges of carbon nanotubes. In this way, it will reflect the nano-size effect of carbon nanotube, rather than the inner-wall structure of carbon nanotubes.

Preferably, the SEM image provides two-dimensional information, which decides the range of fractal dimension values from 1.0 to 2.0.

Another embodiment of the invention is the numerical characterization method for the evaluation of the dispersion state of carbon nanotube based on fractal dimension, the method comprises the following steps.

(1) Adopting different dispersion conditions to disperse carbon nanotubes to obtain various dispersion states of carbon nanotubes, and then diluting the carbon nanotubes dispersion to obtain the sample solutions for SEM imaging.

(2) Putting a certain amount of the diluted sample solution on a clean silicon wafer, and capturing images of carbon nanotubes on the silicon wafer by SEM after the solvent is completely volatilized.

(3) Performing a black and white binary process on the SEM images, and then extracting the boundary edges of individual carbon nanotubes or carbon nanotubes agglomerates in the images.

(4) Obtaining a series of corresponding counts of the boxes $N_i$ by constantly changing the size $\delta_i$ of the boxes covering the boundary of the carbon nanotubes in the image by using the aforementioned calculation method, and then calculating the fractal dimension values of the processed image to achieve the quantitative characterization of the dispersion state of carbon nanotubes.

Preferably, in step (1), the step of adopting different dispersion conditions to disperse carbon nanotubes includes: weighing different amounts of carbon nanotubes, adding the carbon nanotubes to an organic solvent with a certain volume to prepare the precursor solutions with different carbon nanotube concentrations, and then using various dispersion methods with different dispersion mechanisms to obtain various dispersion states of carbon nanotubes by tuning dispersion time and dispersion power.

Preferably, in step (1), the dilution ratio of carbon nanotube dispersion is 100 times.

Preferably, in step (2), the solvent volatilization is operated at the room temperature.

Preferably, in step (2), before taking SEM images, the samples are treated with gold spraying for 80 seconds.

Preferably, in step (3), the noises of the images are required to be eliminated through image processing.

To be specific, in step (1), the different dispersion conditions relate to the variables such as different dispersion methods (or different dispersion mechanisms), different dispersion time, different dispersion power, different dispersion concentrations, etc., and the dilution ratio of carbon nanotube dispersion is 100 times.

In step (2), a certain amount of different diluted carbon nanotube dispersion is put on a silicon wafer, and the amount of the dispersion should be kept the same. The SEM images of carbon nanotubes should be obtained under the same magnification and scale bar.

In step (3), the extraction of the boundary of the individual carbon nanotube or the carbon nanotube agglomerates should be accurate so that the interference from the inner boundary of carbon nanotube agglomerates can be eliminated. The calculated value of fractal dimension quantitatively describe the abundant information of the dispersion state of carbon nanotubes.

According to another aspect of the invention, an application of the numerical characterization method for the dispersion states of carbon nanotubes in controlling and predicting the electrical properties of carbon nanotubes composites is further provided.

Overall, compared with the prior art, the above technical solution conceived by the present invention may achieve the following beneficial results due to the quantitative characterization of the dispersion state of carbon nanotubes.

(1) The numerical characterization for the dispersion state of carbon nanotubes in SEM images is realized through fractal dimension, and the abundant information included in the dispersion state of carbon nanotubes can be described by a value.

(2) After obtaining SEM images, the SEM images can be directly processed and evaluated by means of ImageJ software, and such process does not require additional experimental treatment and characterization approaches, so the operation is simple and convenient.

(3) By quantitatively characterizing the dispersion states of carbon nanotubes, some different dispersion states of carbon nanotubes that cannot be distinguished by naked eyes can be distinguished simply and intuitively according to the different values of fractal dimension.

(4) By means of the numerical characterization of the dispersion states of carbon nanotubes, the relationship between dispersion states of carbon nanotubes and the properties of the composite material is established. It provides guidance for the controlling and prediction of the properties of carbon nanotubes composites.

BRIEF DESCRIPTION OF THE DRAWINGS

FIG. 3 (*b*) is a figure of the fractal dimension calculated from the actual size of the box in the images of the dispersion state of carbon nanotubes obtained in Embodiment 4.

DESCRIPTION OF THE EMBODIMENTS

Figure 1:
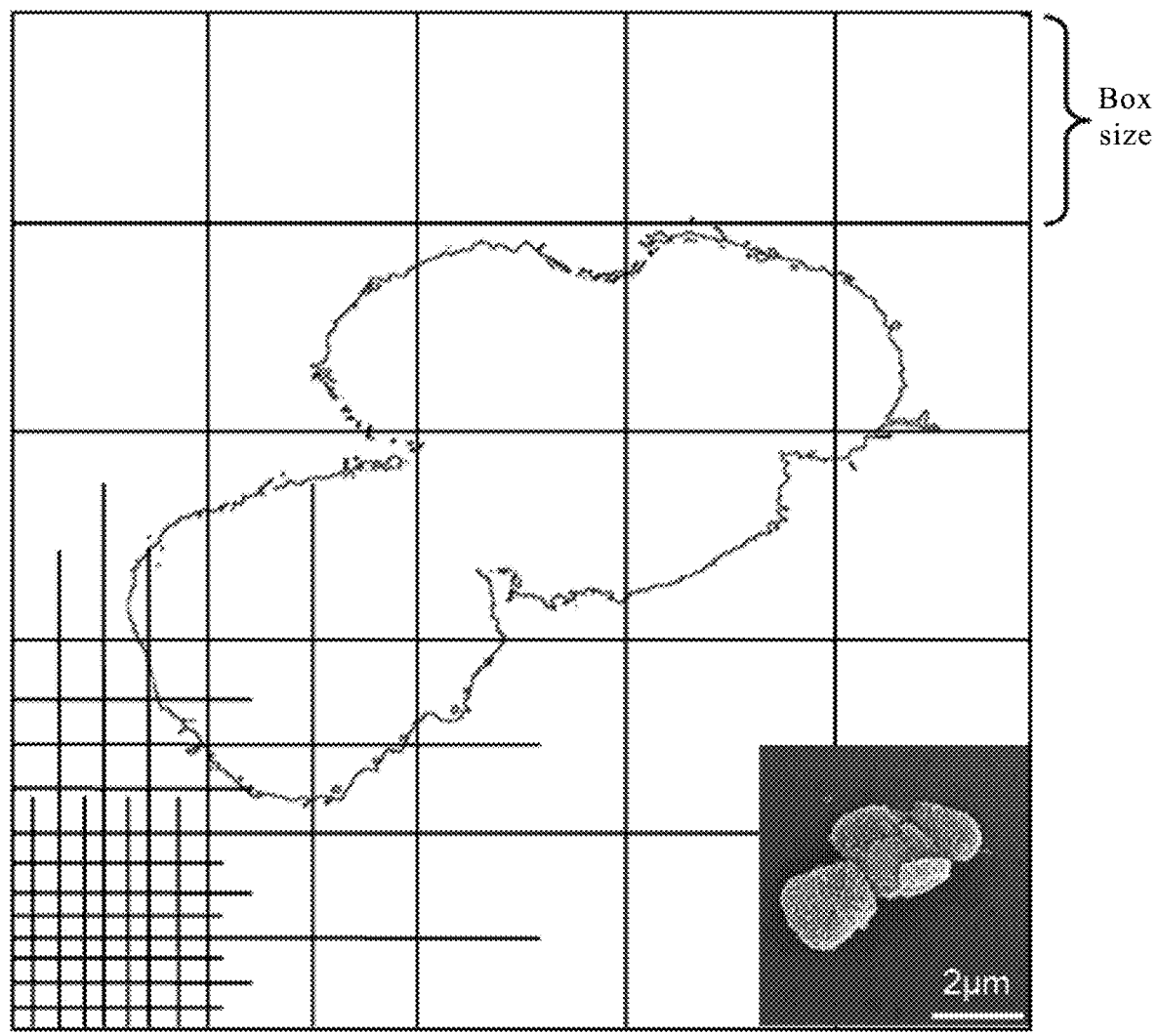
FIG. 1 is a schematic view of a scanning electron microscope image and a box-count algorithm of the dispersion state of carbon nanotubes obtained in Embodiment 1.

In order to make the purpose, technique and advantages of the invention clearer, the invention is further described in detail in the combination with the attached drawings and embodiments as follows. It should be understood that the specific embodiments described herein are merely used for explaining the invention and are not intended to limit the invention. Furthermore, the technical features involved in the various embodiments of the invention described below can be combined with each other as long as they do not conflict with each other.

The invention provides a calculation method of SEM image based on fractal dimension, which adopts the box-count algorithm, and the equation of the box algorithm is:

$$D = \lim_{i \to \infty} \frac{\ln N_i}{\ln \delta_i}$$

where $\delta_i$ is the side size of a box, $N_i$ is the total number of boxes with the side size of $\delta_i$ covering the region occupied by the boundary of carbon nanotubes or carbon nanotube agglomerates in a binary image, and D is the value of fractal dimension.

In a preferred embodiment of the invention, the minimum size of the side size $\delta_i$ in an image is the length represented by one pixel, and the maximum size of the side size is the length represented by a total number of pixels in a horizontal or a vertical direction in an image.

In a preferred embodiment of the invention, for an image, the length represented by a pixel is between 0.34 nm and 100 nm, so that when the boxes with the minimum size cover the boundary, it will reflect the nano-size effect of carbon nanotubes, rather than the inner-wall structure of carbon nanotubes.

In a preferred embodiment of the invention, the SEM image provides two-dimensional information, which decides the range of fractal dimension values from 1.0 to 2.0.

Another embodiment of the invention provides a numerical characterization method for the dispersion state of carbon nanotubes based on fractal dimension, and the method comprises the following steps.

(1) Adopting different dispersion conditions to disperse carbon nanotubes to obtain various dispersion states of carbon nanotubes, and then diluting them to obtain sample solutions.

(2) Putting a certain amount of the diluted sample solution on a clean silicon wafer, and imaging the dispersion state of carbon nanotubes on the silicon wafer after the solvent is completely volatilized.

(3) Performing black and white binary process on the image obtained by SEM, and extracting the boundary of the individual carbon nanotube or carbon nanotube agglomerates in the image.

(4) Obtaining a series of corresponding numbers of boxes $N_i$ by constantly changing the size $\delta_i$ of the boxes covering the boundary of carbon nanotubes in the image. By using the aforementioned calculation method, the fractal dimension of the processed image is calculated to realize the quantitative characterization of the dispersion state of carbon nanotubes.

In a preferred embodiment of the invention, in step (1), the step of dispersing carbon nanotubes with different dispersion conditions includes: weighing different amounts of carbon nanotubes, adding the carbon nanotubes to organic solvent with a certain volume to prepare precursor solutions in different concentrations, and then using various dispersion methods with different dispersion mechanisms to obtain various dispersion states of carbon nanotubes by tuning dispersion time and dispersion power.

In a preferred embodiment of the invention, in step (1), a dilution ratio of carbon nanotube dispersion is 100 times.

In a preferred embodiment of the invention, in step (2), solvent volatilization is operated at room temperature.

In a preferred embodiment of the invention, in step (2), before taking SEM images, the sample is treated with gold spraying and the time of gold spraying is 80 seconds.

In a preferred embodiment of the invention, in step (3), the noises of images are eliminated through the image processing.

The invention provides a numerical characterization method for dispersion state of carbon nanotubes based on fractal dimension, and the method can represent the abundant information of the dispersion state of carbon nanotubes by a value, thereby making it applicable to the controlling and prediction of the electrical properties of carbon nanotubes composites.

Seven embodiments are provided below to further explain the invention in detail.

Embodiment 1

(1) Carbon nanotubes of 0.1 g are immersed in a certain volume of the organic solvent of methyl isobutyl ketone for 5 minutes, and then ball milling (impact-grinding mechanism) is adopted to grind the above mixture, where the grinding time is 30 minutes and the grinding speed is 200 r/minute. Thereafter, 50 µl of the grinded carbon nanotube dispersion is quantitatively taken out by using a pipette to put into a 25 ml serum bottle, which is then diluted by 100 times by using the methyl isobutyl ketone solvent, and is oscillated by using an ultrasonic cleaner for 2 minutes.

(2) A certain amount of silicon wafers is cleaned to keep their bright side clean. Then, a certain amount of the diluted carbon nanotube dispersion is taken by a pipette to dip on the clean silicon wafers. Waiting for 5-10 minutes until the solvent is volatilized completely. Then, the prepared sample is treated with gold spraying for 80s, and then being imaged by SEM with a magnification of 40,000×.

(3) The obtained SEM image is converted into a black and white binary image by using ImageJ software, and the noises of the image are eliminated. Then the boundary of the individual carbon nanotube or carbon nanotube agglomerates in the image is extracted by using the boundary extracting function of the software.

(4) The box-count algorithm is adopted to calculate the fractal dimension of the abovementioned images. During the calculation, a series of corresponding numbers of boxes are obtained by constantly changing the size of the boxes $\delta_i$, and the fractal dimension of the images is obtained according to the equation.

Embodiment 2

The embodiment 1 is repeated with the same steps as described above, and the difference is that in step (1), the carbon nanotubes of 0.5 g are measured, and then conical milling (shear-emulsification mechanism) is adopted to disperse the carbon nanotube/methyl isobutyl ketone mixture, where a grinding time is 75 minutes and a grinding speed is 180 r/minute.

Embodiment 3

The embodiment 1 is repeated with the same steps as described above, and the difference is that the step (1), the carbon nanotubes of 1.0 g are measured, and then dispersing the carbon nanotube/methyl isobutyl ketone mixture by ultrasonic method (cavitation mechanism) with the ultrasonic time of 120 minutes and the ultrasonic power of 480 W.

Embodiment 4

The embodiment 3 is repeated with the same steps as described above, and the difference is as follows.

(1) In step (1), the carbon nanotubes of 0.5 g are measured, and then the ultrasonic method (the cavitation mechanism) is also adopted to disperse the carbon nanotube/methyl isobutyl ketone mixture.

(2) In step (2), the dispersion of carbon nanotubes is dropped on the silicon wafers the SEM imaging of the dispersion state of carbon nanotubes with the magnification of 20,000×, 40,000×, and 80,000×. Moreover, the dispersion of carbon nanotubes is dropped onto a glass slide and a copper mesh, respectively. It should be noted that these two samples don't require spray treatment, and are used for optical microscope (100×) and TEM imaging (160,000×).

Embodiment 5

The embodiment 1 is repeated with the same steps as described above, and the difference is the following.

(1) A series of carbon nanotubes with different masses are added to the organic solvents of methyl isobutyl ketone, respectively, and the dispersion methods with different dispersion mechanisms (such as vortex-jet mechanism, cavitation mechanism, impact-grinding mechanism and shear-emulsification mechanism) are respectively applied to disperse the carbon nanotube/methyl isobutyl ketone mixtures. Various dispersion states of carbon nanotubes are obtained by changing the concentration, dispersion time and dispersion power.

(2) In step (2), the SEM images are taken at different areas of each sample with the same magnification of 40,000×. The total amount of SEM images for each sample is 3-5.

(3) in step (4), the fractal dimension of the same sample is obtained by averaging the fractal dimension of 3-5 images and the corresponding standard deviation is calculated.

Embodiment 6

The embodiment 5 is repeated with the same steps as described above except that in step (1), the carbon nanotubes with different masses are added to the organic solvent of methyl isobutyl ketone, and then the ultrasonic method (the cavitation mechanism) is adopted to disperse the above mixtures. During the above process, the ultrasonic time (for example, 10 minutes, 30 minutes, 60 minutes, 90 minutes, 120 minutes), and the ultrasonic power (for example, 320 W, 400 W, 480 W, 560 W) are controlled to obtain different dispersion states of carbon nanotubes.

Embodiment 7

The fractal dimension of the sample calculated in the embodiment 6 is fitted to the electrical conductivity of the sample to establish the relationship between dispersion states of carbon nanotubes and the electrical conductivity of composites. According to the above relationship, controlling and prediction of the electrical properties of composites are realized with the assistance of fractal dimension.

Experimental Result Analysis

The SEM image with the magnification of 40,000× obtained in the embodiment 1 is shown as the right part of FIG. 1 as below. The ImageJ software is used to binarize the image in black and white, and then extract the boundary of individual carbon nanotubes or carbon nanotubes agglomerates, as shown in FIG. 1. The calculation principle of the box-count algorithm is show in FIG. 1. The processed image is divided into square grids (boxes) with a certain size, and the total number of the boxes covering the boundary of individual carbon nanotube or carbon nanotube agglomerates is then obtained. Thereafter, the size of the divided square grids is varied to obtain another set of total number of the boxes. A series of total numbers of the boxes corresponding to certain box sizes are obtained by using similar method, and the quantitative characterization of the dispersion state of carbon nanotubes is realized through the calculation based on the equation of fractal dimension.

Figure 2:
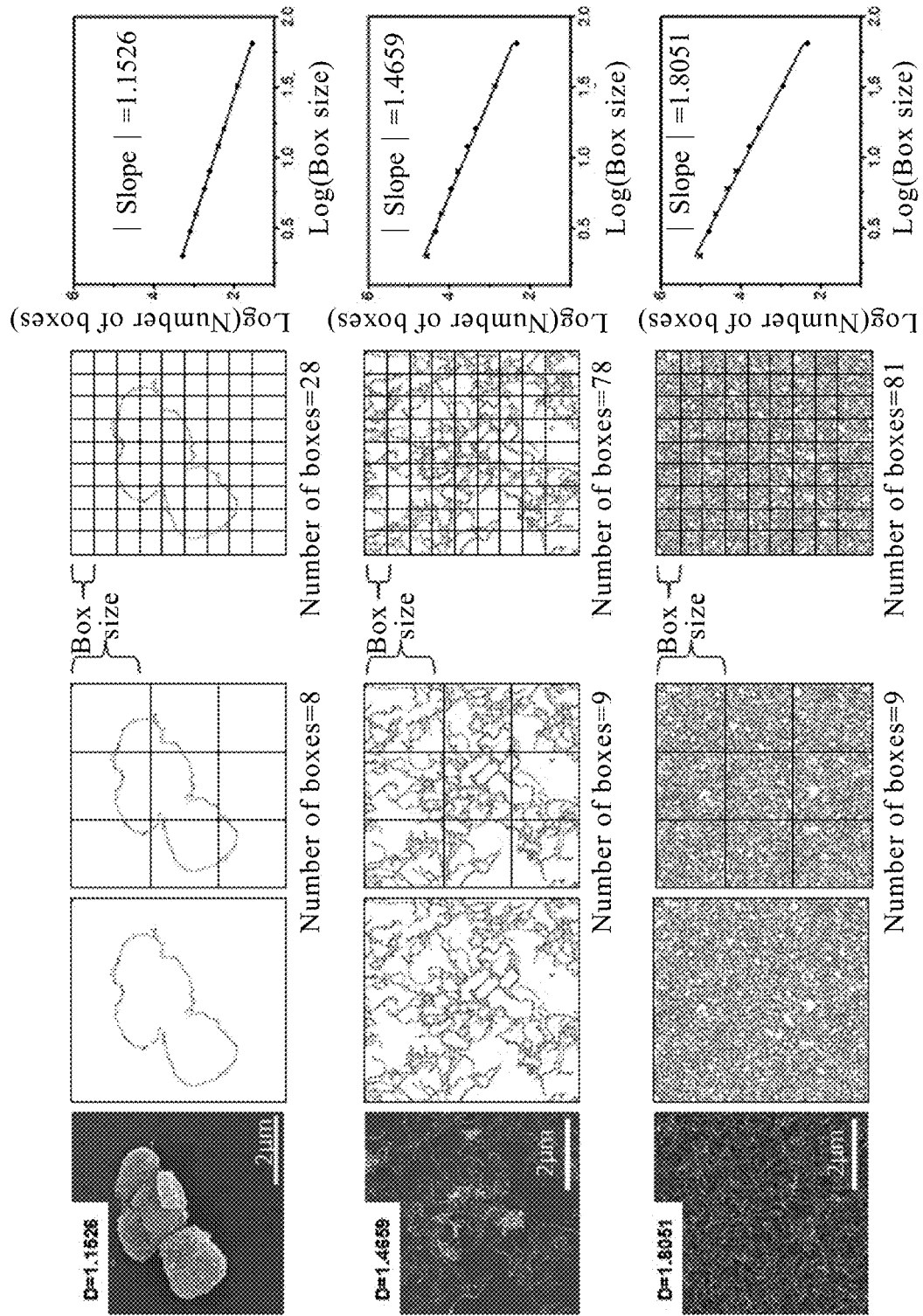
FIG. 2 is a schematic view of a comparison of scanning electron microscope images and the box-count algorithm of the dispersion state of carbon nanotubes obtained in Embodiments 1-3.

By comparing the SEM images obtained in the embodiments 1-3, as shown in FIG. 2, the dispersion states of carbon nanotubes are quite different from each other. After extracting the boundary of the images, different box numbers are obtained by using the boxes of the same size to cover the region occupied by individual carbon nanotubes or the carbon nanotube agglomerates. Then, plotting the curve of logarithms of the number of boxes versus the box size according to the box-count algorithm. The fractal dimension of the image can be calculated from the slope of the curve. According to the fitting curve, the slope (1.1526) of the curve in the embodiment 1 is smaller than the slope (1.4659) of the curve in the embodiment 2, and the slope of the curve in the embodiment 2 is smaller than the slope (1.8051) of the curve in the embodiment 3. The differences between the dispersion states of carbon nanotubes can be clearly distinguished according to the differences of fractal dimension values. The carbon nanotubes in agglomerated state show a smaller fractal dimension value. While carbon nanotubes in disentangled state show a larger fractal dimension value. Ideally, when agglomerated carbon nanotubes cover the image completely, the fractal dimension value is 1.0; and when the perfectly disentangled carbon nanotubes cover the image, the fractal dimension is 2.0.

Figure 3A:
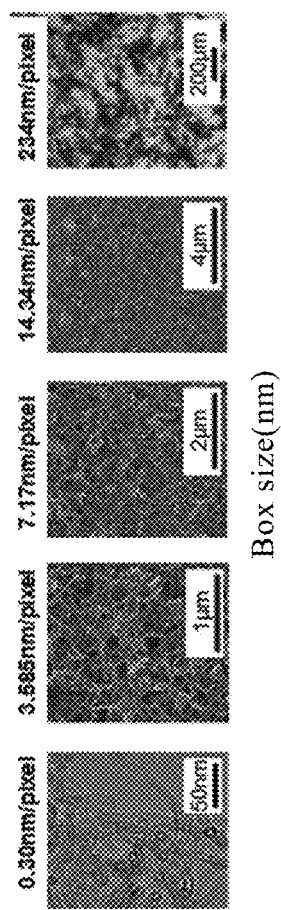
FIG. 3 (*a*) is a transmission electron microscope image, scanning electron microscope images, and an optical microscope image of the same dispersion state of carbon nanotubes obtained in Embodiment 3.
Figure 3B:
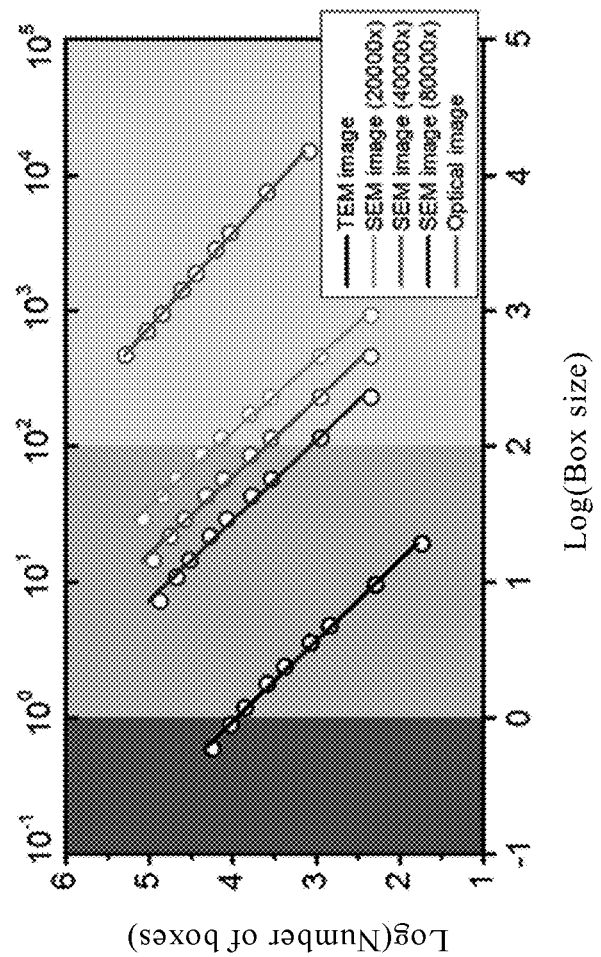

In the embodiment 4, the images of the dispersion states of carbon nanotubes of the same sample taken by TEM (160,000 x), SEM (20,000 x, 40,000 x and 80,000 x), and optical microscope (100 x) are obtained. According to the actual scales of images, the actual length represented by one pixel in each image is calculated, as shown in FIG. 3($a$). For the optical microscope image (100 x) and the TEM image (160,000 x), the actual lengths represented by one pixel (the minimum box size) are 234 nm and 0.30 nm, respectively. The former one is far larger than the upper limit of 100 nm defined by nano-scale, and the calculated fractal dimension cannot reflect the nano-size effect of carbon nanotubes; the latter one is smaller than the intertube spacing of 0.34 nm, so that the calculated fractal dimension reflects the morphology information of inner walls of carbon nanotubes. For an appropriate image, the length represented by one pixel should be between 0.34 nm and 100 nm. For the aforementioned images, the curves of logarithms of the actual box sizes versus the numbers of boxes corresponding to the different sizes are plotted, as shown in FIG. 3($b$). The fractal dimensions of the SEM images with three different magnifications can all be used to quantitatively describe the dispersion state of carbon nanotubes.

Figure 4:
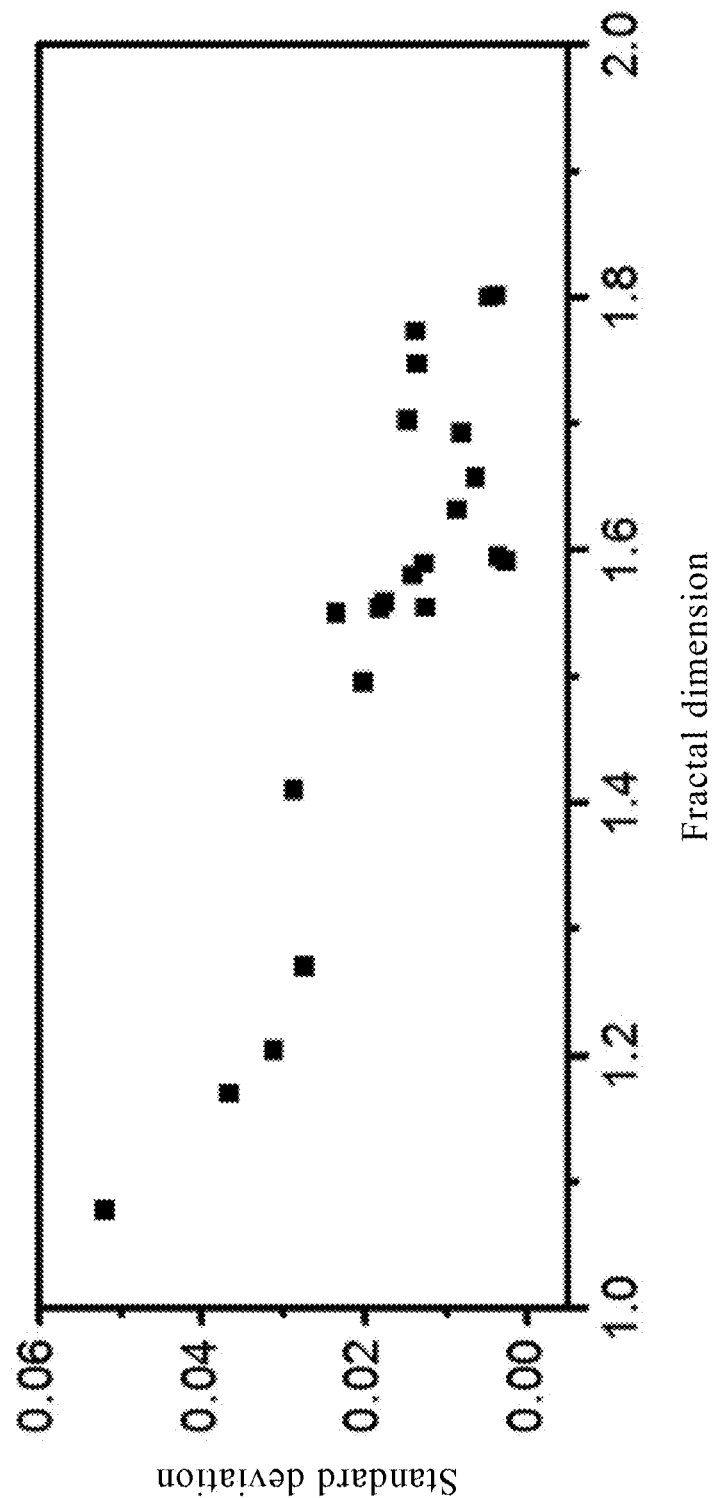
FIG. 4 is a figure of the standard deviation of the value of fractional dimension of the dispersion state of carbon nanotubes.

In the embodiment 5, the fractal dimension values of various dispersion states of carbon nanotubes are obtained. Their standard deviations indicate the distribution uniformity of carbon nanotubes in dispersion system, as shown in FIG. 4. In FIG. 4, the standard deviation is gradually decreased with the increasing fractal dimension, which suggests the improvement of uniform distribution of carbon nanotubes in dispersion.

Figure 5:
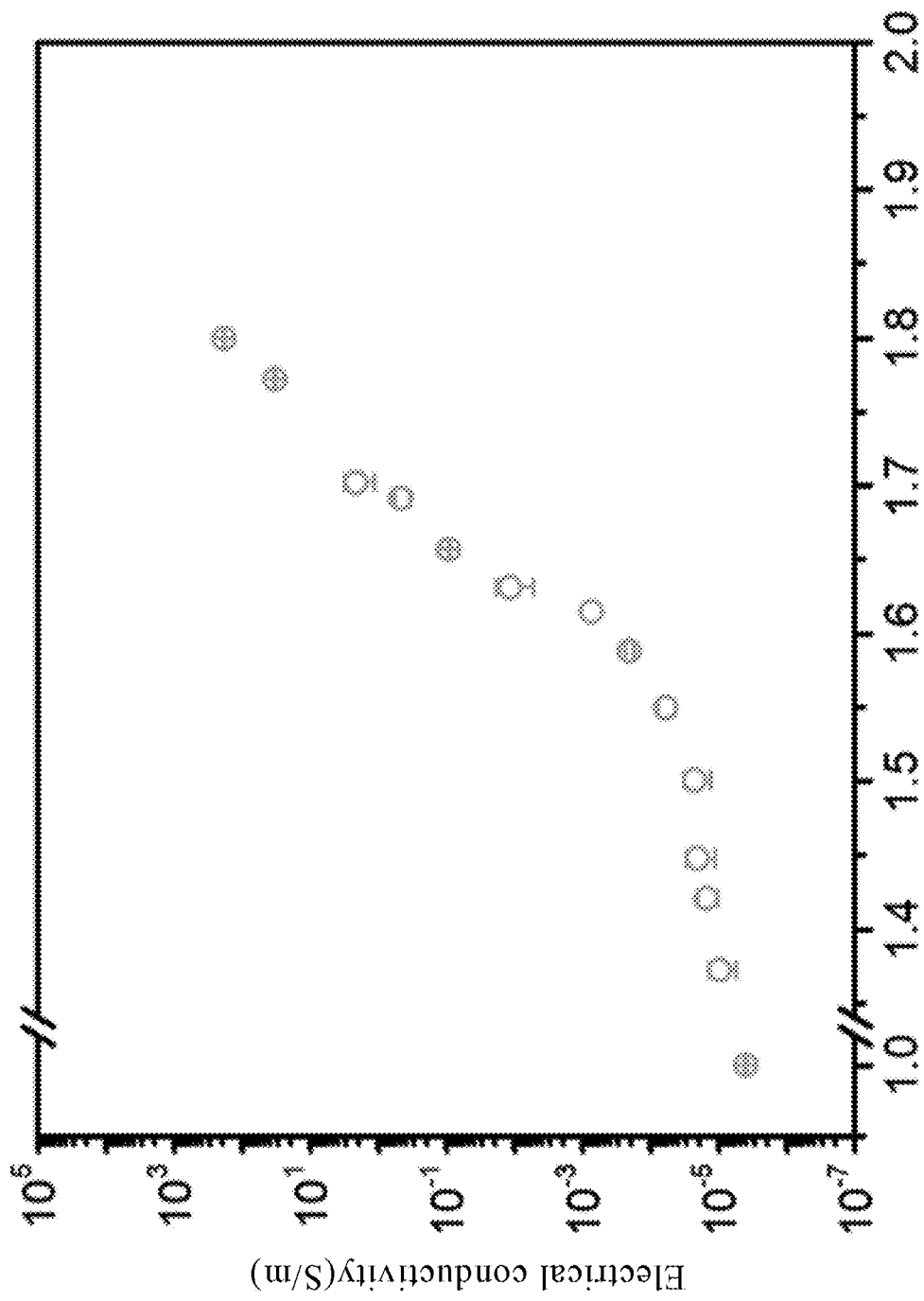
FIG. 5 is a fitting curve of the electrical conductivity and the dispersion state of carbon nanotubes in Embodiments 6 and 7.

Combining the embodiment 6 with the embodiment 7, the relationship between the dispersion states of carbon nanotubes and the electrical properties of the composites is established, as shown in FIG. 5. In the embodiment 6, the ultrasonic method (cavitation mechanism) is used to disperse carbon nanotubes. When the fractal dimension value is lower than a certain value, the electrical conductivity of composites is kept at the same level like the substrate; while the fractal dimension value exceeds a certain value, the electrical conductivity of composites begins to increase rapidly, which indicates the formation of conductive paths in composites. Moreover, when the fractal dimension exceeds the certain value, the electrical conductivity of composites is proportional to the fractal dimension of the dispersion state. Therefore, the fractal dimension of the dispersion state of carbon nanotubes can not only be used to judge whether the conductive paths are form or not in composites, but also be applied to predict the electrical conductivity of composites.

It will be apparent to those skilled in the art that various modifications and variations can be made to the disclosed embodiments without departing from the scope or spirit of the invention. In view of the foregoing, the invention is intended to cover the modifications and variations provided that fall within the scope of the following claims and their equivalents.

What is claimed is:

1. A numerical characterization method for the dispersion states of carbon nanotubes based on fractal dimension, comprising:
    (1) adopting different dispersion conditions to disperse carbon nanotubes for obtaining various dispersion states of carbon nanotubes, and diluting the dispersion liquids to obtain the sample solutions;
    (2) putting the certain amount of the diluted sample solution on a clean silicon wafer, and using a scanning electron microscope to image the dispersion states of the carbon nanotubes on the silicon wafer after the solvent is completely volatilized;
    (3) performing a black and white binary process on the image obtained by the scanning electron microscope, and extracting the boundary of individual carbon nanotubes or carbon nanotube agglomerates in the image;
    (4) obtaining a series of corresponding numbers of boxes $N_i$, by constantly varying the side size $\delta_i$ of boxes covering the boundary of carbon nanotube in the image, and thereby calculating the fractal dimension of the processed image by box-count algorithm to achieve the quantitative characterization of the dispersion state of the carbon nanotubes, wherein the equation of the box-count algorithm is:

$$D = \lim_{i \to \infty} \frac{\ln N_i}{\ln \delta_i}$$

wherein $\delta_i$ is the side size of a box, $N_i$, is the total number of boxes with the side size of $\delta_i$ covering a region occupied by the boundary of individual carbon nanotubes or carbon nanotubes agglomerates in the processed image, and D is the fractal dimension.

2. The numerical characterization method as claimed in claim 1, wherein in step (1), the step of adopting different dispersion conditions to disperse carbon nanotubes comprises: weighing different amounts of carbon nanotubes, adding the carbon nanotubes to a kind of organic solvent with a certain volume to prepare precursor solutions with different concentrations, and then using various dispersion methods with different dispersion mechanisms to obtain various dispersion states of carbon nanotubes by controlling the dispersion time and the dispersion power.

3. The numerical characterization method as claimed in claim 2, wherein the dilution ratio of carbon nanotube dispersion liquids in step (1) is 100 times.

4. The numerical characterization method as claimed in claim 3, wherein the solvent volatilization in step (2) is operated at room temperature.

5. The numerical characterization method as claimed in claim 4, wherein in step (2), before scanning electron microscope imaging, the sample is treated with gold spraying for 80 seconds.

6. The numerical characterization method as claimed in claim 5, wherein in step (3), the noises of the image are eliminated through image processing.

7. The numerical characterization method as claimed in claim 6, wherein in step (4), the minimum size of the side size 6 in an image is the length represented by one pixel, and the maximum size of the side size is the length represented by a total number of pixels in a horizontal or a vertical direction in an image.

8. The numerical characterization method as claimed in claim 7, wherein in step (4), in an image, the length represented by one pixel is between 0.34 nm and 100 nm.

9. The numerical characterization method as claimed in claim 8, wherein in step (4), the calculated fractal dimension is between 1.0 and 2.0.

10. The numerical characterization method as claimed in claim 1, wherein the dilution ratio of the carbon nanotube dispersion liquids in step (1) is 100 times.

11. The numerical characterization method as claimed in claim 10, wherein the solvent volatilization in step (2) is operated at room temperature.

12. The numerical characterization method as claimed in claim 11, wherein in step (2), before scanning electron microscope imaging, the sample is treated with gold spraying for 80 seconds.

13. The numerical characterization method as claimed in claim 12, wherein in step (3), the noises of the image are eliminated through image processing.

14. The numerical characterization method as claimed in claim 13, wherein in step (4), the minimum size of the side size 6, in an image is the length represented by one pixel, and the maximum size of the side size is the length represented by a total number of pixels in a horizontal or a vertical direction in an image.

15. The numerical characterization method as claimed in claim 14, wherein in step (4), in an image, the length represented by one pixel is between 0.34 nm and 100 nm.

16. The numerical characterization method as claimed in claim 15, wherein in step (4), the calculated fractal dimension is between 1.0 and 2.0.

* * * * *